US012588546B2

(12) United States Patent
Knipper et al.

(10) Patent No.: US 12,588,546 B2
(45) Date of Patent: Mar. 24, 2026

(54) SEMICONDUCTOR DEVICE COMPRISING A SEMICONDUCTOR DIE AND A CARRIER BOTH COVERED BY A PARYLENE COATING

(71) Applicant: Infineon Technologies AG, Neubiberg (DE)

(72) Inventors: Richard Knipper, Regensburg (DE); Thorsten Meyer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 964 days.

(21) Appl. No.: 17/686,558

(22) Filed: Mar. 4, 2022

(65) Prior Publication Data

US 2022/0301959 A1 Sep. 22, 2022

(30) Foreign Application Priority Data

Mar. 5, 2021 (EP) ..................................... 21160952

(51) Int. Cl.
 H01L 23/29 (2006.01)
 H01L 21/56 (2006.01)
(52) U.S. Cl.
 CPC ............ H01L 23/293 (2013.01); H01L 21/56 (2013.01)

(58) Field of Classification Search
 CPC ...................................................... H01L 23/293
 See application file for complete search history.

(56) References Cited

U.S. PATENT DOCUMENTS

| | | | |
|---|---|---|---|
| 7,116,557 B1 | 10/2006 | Raby et al. | |
| 8,541,877 B2 * | 9/2013 | Tsai .................. | H01L 23/49816 |
| | | | 257/738 |
| 8,710,680 B2 * | 4/2014 | Chang ..................... | H01L 21/50 |
| | | | 257/784 |
| 2003/0134455 A1 * | 7/2003 | Cheng ............... | H01L 23/49822 |
| | | | 438/106 |
| 2015/0001700 A1 | 1/2015 | Hartung et al. | |
| 2015/0155267 A1 * | 6/2015 | Hoegerl ................ | H01L 25/105 |
| | | | 257/779 |
| 2017/0011982 A1 | 1/2017 | Theuss et al. | |
| 2017/0287880 A1 | 10/2017 | Fuergut et al. | |
| 2018/0040530 A1 * | 2/2018 | Mahler ................... | H01L 24/29 |

FOREIGN PATENT DOCUMENTS

WO WO-2020116718 A1 * 6/2020 ........ H01L 21/02118

* cited by examiner

*Primary Examiner* — Sue A Purvis
(74) *Attorney, Agent, or Firm* — Murphy, Bilak & Homiller, PLLC

(57) ABSTRACT

A semiconductor device includes a carrier comprising a recess, a semiconductor die disposed in the recess, and a parylene coating covering at least portions of the surfaces of the semiconductor die and the carrier.

13 Claims, 5 Drawing Sheets

SEMICONDUCTOR DEVICE COMPRISING A SEMICONDUCTOR DIE AND A CARRIER BOTH COVERED BY A PARYLENE COATING

TECHNICAL FIELD

The present disclosure is related to a semiconductor device, a semiconductor device module, a method for fabricating a semiconductor device, and a method for fabricating a semiconductor device module.

BACKGROUND

Over the last couple of years a lot of activities have been carried out concerning the embedding of active semiconductor dies into PCB or package carrier systems. A particular challenge is related to the embedding of medium and high-voltage chip-carrier subassemblies like, for example, MOSFET or IGBT devices, as challenges in handling, stability and ion protection have to be fulfilled. More specifically, new medium and high-voltage chip-carrier subassemblies need to be stable during transport, handling and storing, they need to be insulated against source-drain and source-gate shorts based on insufficient MC penetration, they need to be protected against ion-migration due to high voltages, and the edge termination needs to be left fully functional as design adaptation is not feasible.

Possible solutions include a mold-capping of dies mounted on the actually used copper die carrier. This will result in a split in production between "protected" chip-carrier subassemblies having a moldcap and "unprotected" chip-carrier subassemblies with bare dies. This, combined with increased packaging cost, may be a hindering factor in increased market penetration. Further, it is unclear whether this approach is compatible with existing processing steps. The position of the die with the respective die pads on the copper carrier is not visible anymore through the mold compound, which makes alignment of the laser for via drilling very difficult. In addition, the minimal thickness of mold-capping will result in a need for process development.

SUMMARY

A first aspect of the present disclosure is related to a semiconductor device, comprising a carrier comprising a recess, a semiconductor die disposed in the recess, and a parylene coating covering at least portions of the surfaces of the semiconductor die and/or the carrier.

A second aspect of the present disclosure is related to a semiconductor device module, comprising an insulation layer and a semiconductor device according to the first aspect, the semiconductor device being embedded in the insulation layer.

A third aspect of the present disclosure is related to a method for fabricating a semiconductor device, the method comprising providing a carrier comprising a recess, providing a semiconductor die and disposing the semiconductor die in the recess, and applying a parylene coating onto the carrier and the semiconductor die.

A forth aspect of the present disclosure is related to a method for fabricating a semiconductor device module, the method comprising providing a semiconductor device as fabricated according to the method of the third aspect, and embedding the semiconductor device in an insulation layer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of the embodiments will be readily appreciated as they become better understood by reference to the following detailed description.

The elements of the drawings are not necessarily to scale relative to each other. Like reference numerals designate corresponding similar parts.

DESCRIPTION OF EMBODIMENTS

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the abovementioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

DETAILED DESCRIPTION

Figure 1:
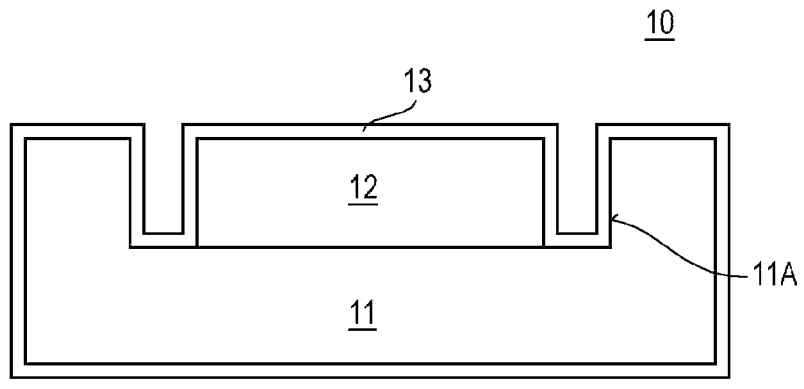
FIG. 1 shows a schematic cross-sectional side view on an example of a semiconductor device according to the first aspect.

FIG. 1 shows an example of a semiconductor device according to the first aspect.

The semiconductor device 10 as shown in FIG. 1 comprises a carrier 11 comprising a recess 11A, a semiconductor die 12 disposed in the recess 11A, and a parylene coating 13 covering all portions of the surfaces of the semiconductor die 12 and the carrier 11 besides a connection surface between the semiconductor die 12 and carrier 11.

Further below it will be explained later by means of FIGS. 6A to 6C how a semiconductor device as shown in FIG. 1 can be fabricated. It will also be shown how a semiconductor device can be fabricated in which a parylene coating 13 covers nearly all portions of the exposed surfaces of the semiconductor die 12 and the carrier 11. There are portions on the lower surface of the carrier 11 which are not covered by the parylene layer 13 since the carrier 11 is not hovering in the tray while being deposited, i.e. the contact points between carrier 11 and tray will not be covered.

Figure 7A:
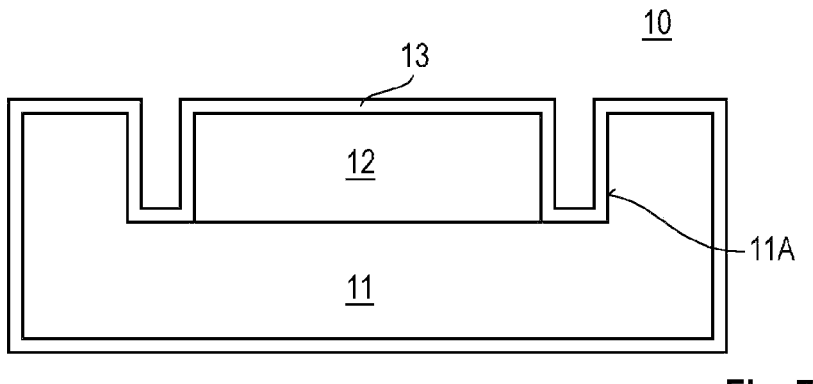
FIG. 7 comprises FIG. 7A to 7D and shows schematic cross-sectional side view representations for illustrating an example of a method for fabricating a semiconductor device module.
Figure 7B:
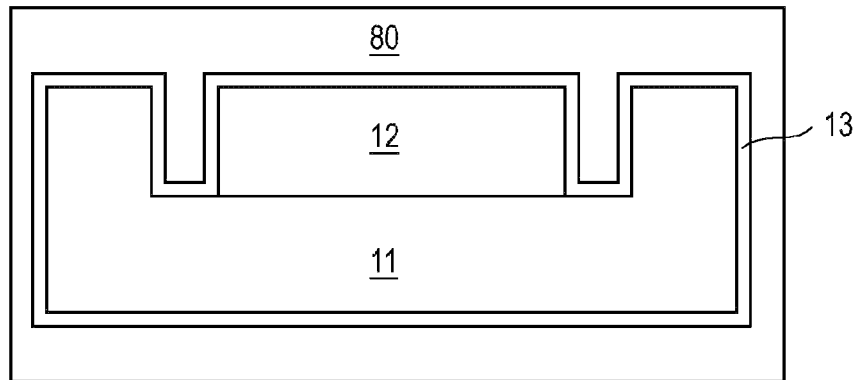
Figure 7C:
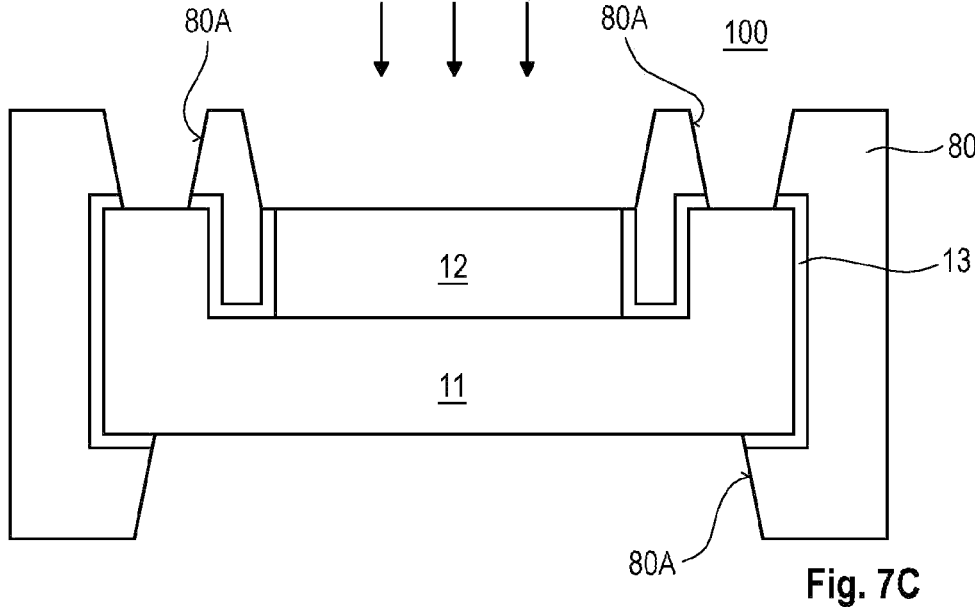
Figures 7D, 8:
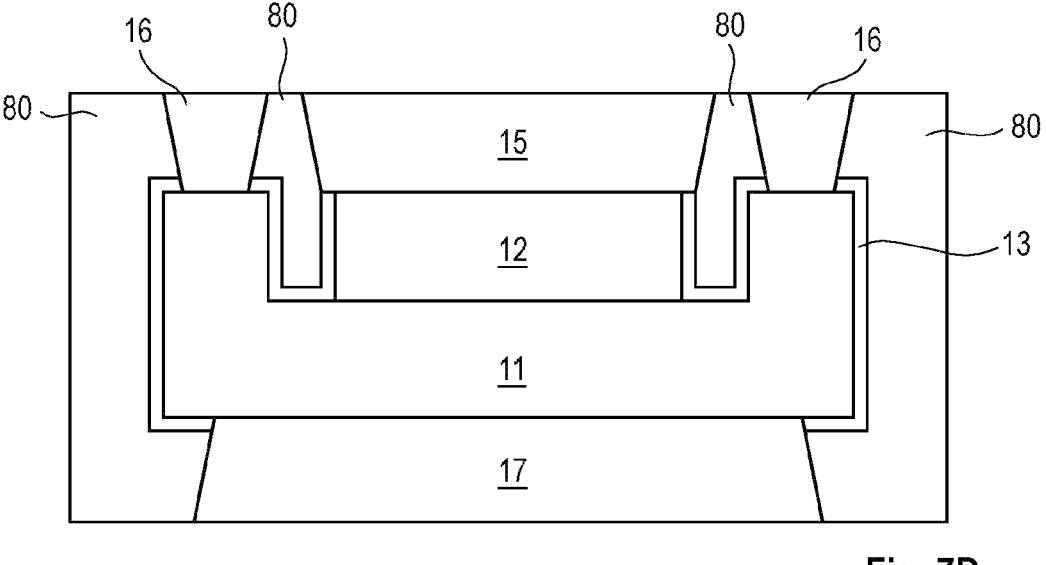
FIG. 8 shows the chemical formula of the backbone of parylene.

Referring to FIG. 8, parylene is the common name of a polymer whose backbone consists of para-benzenediyl rings —C 6H4— connected by 1,2-ethanediyl bridges —CH2-CH2—. It can be obtained by polymerization of para-xylylene H 2C═C 6H4═CH2.

Parylene occurs in various modifications, especially parylene F's superior thermal stability is attributed to its aliphatic C—F bond when compared to parylene C's C—C bond. Possessing aliphatic —CH2— chemistry, parylene F therefore has relatively poor oxidative and UV stability. At the same time, parylene F exhibits a higher coating density and significantly more penetrating power than parylene C, although its refractive index is slightly lower.

Parylene F's continuous service temperature during 100, 000 hours is 200° C., whereas that of Parylene C is 80° C. Hence if 80° C. is sufficient depending on the requirements, Parylene C would be the preferred material since the process costs will be significantly lower. For example, the deposition rate of Parylene F is 2 μm per hour whereas that of Parylene C is much faster.

By establishing a Parylene coating after probing, the production chain of "protected" and "unprotected" devices stays equal. It is possible to add Parylene as an upgrade to chip-carrier subassemblies in order to allow for better mechanical, environmental and short-circuit protection, if customers choose to order these features. By coating dies after testing, no process effort is needed in handling, as well as no dedicated production of these chip-carrier subassemblies, all chip features are visible through the Parylene layer. The coating process itself is non-invasive, permitting coating after testing.

Main advantages of Parylene are:

Scratch protection due to up 10 μm thick polymer layers (as opposed to sub μm thick ALD (atomic layer deposition) layers)

Parylene has a proved capability to be used as ion-barrier, allowing for manufacturers to reduce quality requirements in FR4 materials or other PCB materials, in particular those containing an epoxy material and glass fibers.

No patterning or protection is needed in Parylene coating, since via-drilling in chip embedding also starts thermal breakdown in Parylene.

Coated side-walls with low thermal conductivity Parylene focuses to thermal path, increasing heat flow into thermal vias and reducing heat flow into the insulator layer, in particular the FR4 layer.

Parylene is isolating with a breakthrough voltage of up to 200V/μm

Parylene is robust against chemical breakdown due to its molecular structure

Parylene is close to FR4 or other typical PCB materials in its dielectrical constant.

For example, a parylene material could be selected which comprises a thermal conductivity in a range from 0.05 W/mK to 2 W/mK, in particular around 0.1 W/mK.

According to an example of the semiconductor device of FIG. 1, the parylene coating 13 comprises a thickness in a range from 0.5 μm to 10 μm whereas the lower bound of this range can also be 1 μm, 2 μm, 3 μm, or 4 μm, and the upper bound of this range can also be 9 μm, 8 μm, 7 μm, or 6 μm.

The semiconductor die 12 can be one or more of a semiconductor transistor die, a power semiconductor transistor die, a vertical transistor die, a (power) IGBT die, a (power) MOSFET die, or a thyristor die. In case of any kind of a vertical transistor die, the semiconductor device 10 comprises a first contact pad on a first upper main face and a second contact pad on a second lower main face opposite to the first main face. Besides that, the semiconductor die 12 can be attached to the carrier 11 by, for example, diffusion soldering.

In the example as shown in FIG. 1 the carrier 11 is comprised of a metal, in particular Cu, block like a portion of a leadframe and the recessed area 11A can be formed by, e.g., a coining process.

Figure 2:
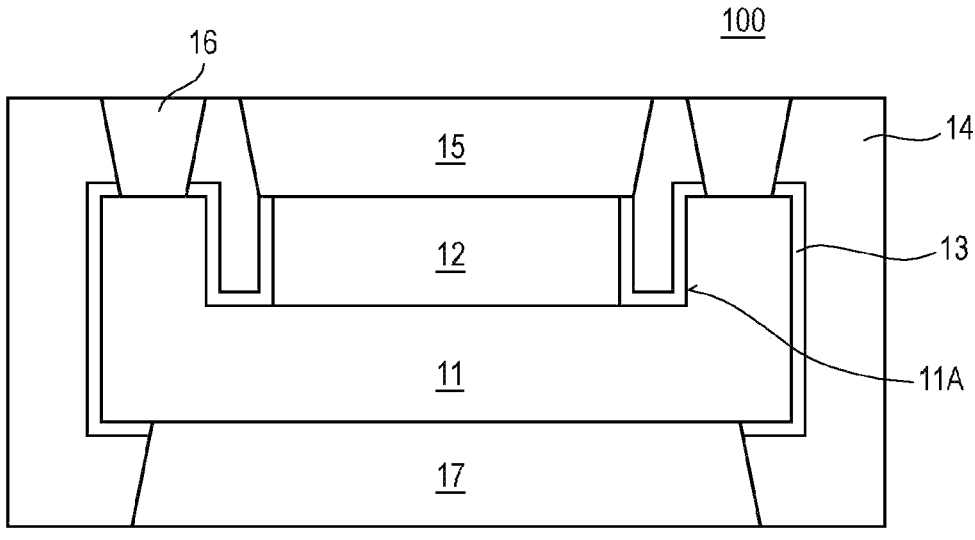
FIG. 2 shows a schematic cross-sectional side view on an example of a semiconductor device module according to the second aspect wherein the collector contact pad is connected with via connections extending to the upper and the lower main faces of the module.

FIG. 2 shows a schematic cross-sectional side view of an example of a semiconductor device module.

The semiconductor device module 100 as shown in FIG. 2 comprises an insulation layer 14, and a semiconductor device 10 like the one shown and described in connection with FIG. 1, wherein the semiconductor device 10 is embedded in the insulation layer 14. A fabrication method of the semiconductor device module 100 will be shown and described in connection with FIG. 7.

The material of the insulation layer 14 may comprise FR4 which is commonly used as material for printed circuit boards (PCBs) in the semiconductor industry. Also other typical PCB materials, in particular those containing an epoxy material and glass fibers, can be used like, for example, FR3 or FR5, or BT epoxy.

The semiconductor device module 100 as shown in FIG. 2 comprises a semiconductor device 10 like the one as shown in FIG. 1 besides the fact that portions of the parylene coating 13 were removed. The semiconductor die 12 as shown in FIG. 2 is a vertical semiconductor transistor die 12, in particular an IGBT die, having a first contact pad on a first upper main face and a second contact pad on a second lower main face. The first contact pad may be an emitter contact pad and the second contact pad may a collector contact pad of the IGBT die.

After applying the insulation layer 14 to the semiconductor device 10, electrical via connectors to the contact pads of the semiconductor die 12 have to be formed into the insulation layer 14 which will be shown later. In a first step through-holes extending to the contact pads are formed into the insulation layer 14 and then the through-holes are filled with a metallic material like Cu to the surfaces of the insulation layer 14. In this way via connectors 15 to 17 are formed wherein a first via connector 15 is connected with the emitter contact pad, a second via connector 16 is connected from above with the carrier 11 and thus with the collector contact pad, and a third via connector 17 is connected from below with the carrier 11 and thus with the collector contact pad. The filling with the metallic material can be performed by electrochemical plating.

Figure 3:
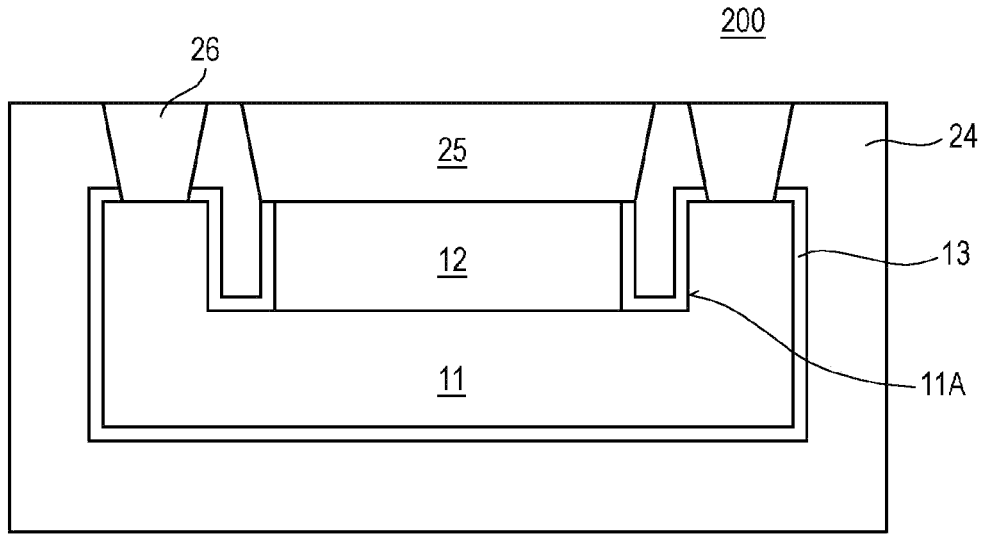
FIG. 3 shows a schematic cross-sectional side view on an example of a semiconductor device module according to the second aspect wherein the emitter and collector contact pads are connected with via connectors extending to the upper main face of the module.

FIG. 3 shows a schematic cross-sectional side view on another example of a semiconductor device module.

The semiconductor device module 200 of FIG. 3 differs from the semiconductor device module 100 of FIG. 2 only in that the third via connector 17 of FIG. 2 is not fabricated. Accordingly in an insulation layer 24 via connectors 25 and 26 are formed wherein a first via connector 25 is connected with the emitter contact pad, a second via connector 26 is connected from above with the carrier 11 and thus with the collector contact pad. As a result, external electrical contacts of the semiconductor device module 200 are only provided on the upper main face of the module 200.

It should be mentioned that a further variant of a semiconductor device module is possible in which the second via connector 16 of the semiconductor device module 200 of FIG. 2 is not fabricated.

Figure 4:
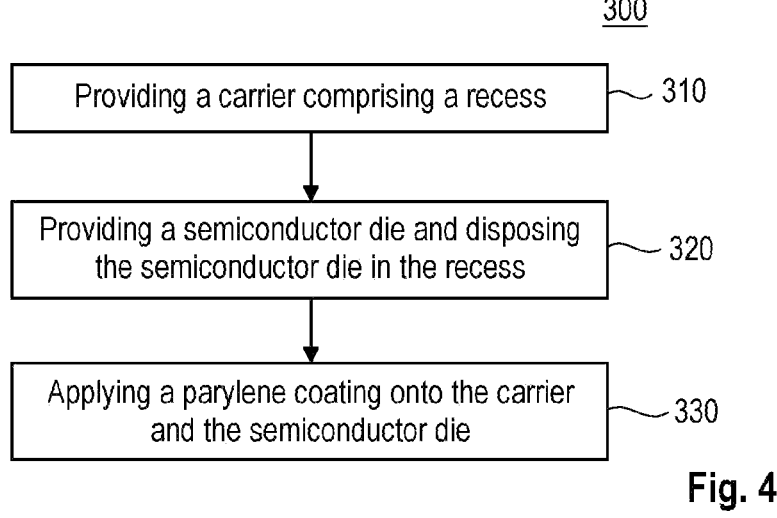
FIG. 4 shows an example of a flow diagram of a method for fabricating a semiconductor device.

FIG. 4 shows an example of a flow diagram of a method for fabricating a semiconductor device.

The method 300 of FIG. 4 comprises providing a carrier comprising a recess (310), providing a semiconductor die and disposing the semiconductor die in the recess (320), and applying a parylene coating onto the carrier and the semiconductor die (320).

Further embodiments of the method 300 can be formed by adding aspects or features which were described above in connection with the semiconductor device according to the first aspect.

Figure 5:
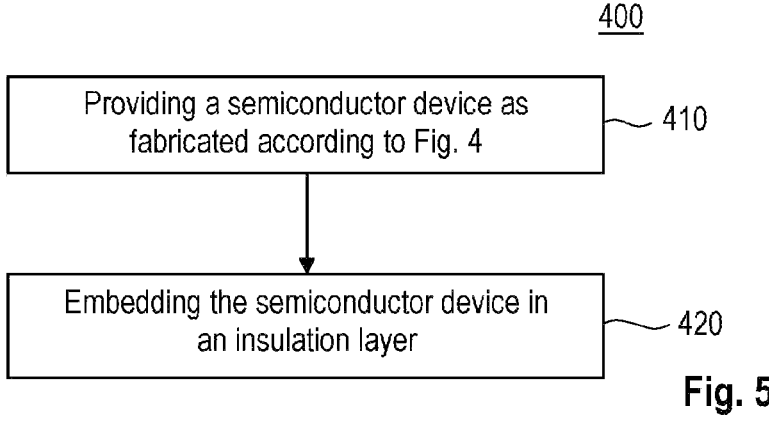
FIG. 5 shows an example of a flow diagram of a method for fabricating a semiconductor device module.

FIG. 5 shows an example of a flow diagram of a method for fabricating a semiconductor device module.

The method 400 of FIG. 5 comprises providing a semiconductor device as fabricated according to FIG. 4 (410), and embedding the semiconductor device in an insulation layer (420).

Further embodiments of the method 400 can be formed by adding aspects or features which were described above in connection with the semiconductor device module according to the second aspect.

Figures 6A, 6B, 6C:
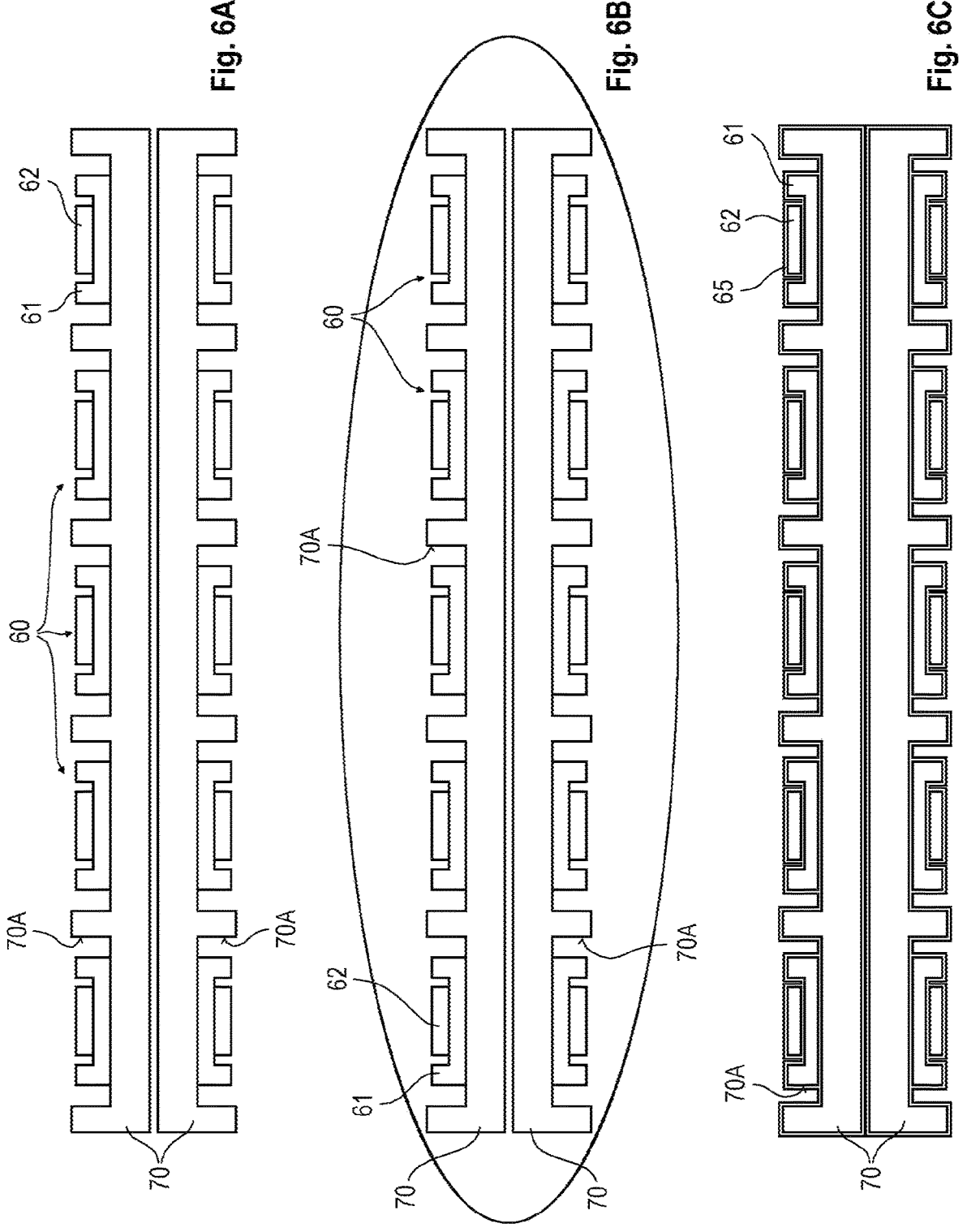
FIG. 6 comprises FIG. 6A to 6C and shows schematic cross-sectional side view representations of trays for illustrating an example of a method for fabricating a semiconductor device.

FIG. 6 comprises FIG. 6A to 6C and illustrates an example of a method for fabricating a semiconductor device.

According to FIG. 6A in a first step a plurality of assemblies 60 are provided, the assemblies 60 each consist of a carrier 61 comprising a recess and a semiconductor die 62 disposed in the recess. The assemblies 60 are placed each one in one of the compartments 70A of a standard JEDEC tray 70 comprising a plurality of compartments 70A arranged in a matrix. Two trays 70 are arranged one on the other in a stacked relationship. The assemblies 60 can be placed loosely in the compartments 70A without being firmly attached to the bottoms of the compartments 70A. The assemblies 60 are not hovering in the trays 70 so there are contact points or areas between the lower surfaces of the assemblies 60 and the surfaces of the trays 70.

As only indicated in FIG. 6B the trays 70 are placed in a deposition apparatus in order to deposit parylene onto the assemblies 60. The oval area in FIG. 6B indicates the atmosphere of thermally decomposed parylene generated in the deposition apparatus. Since the assemblies 60 are only loosely resting on the bottoms of the compartments 70A, the parylene may creep under the lowermost surface of the carriers 61 and can therefore also be deposited on this surface. Theoretically the parylene can also be deposited to a certain extent onto the lower surfaces of the semiconductor dies 62 depending on how the semiconductor dies 62 are attached to the carrier 61.

The parylene deposition process may include vaporizing a solid dimer at a first elevation temperature, e.g. at about 150° C. and 1.0 Torr. The dimer is then decomposed by pyrolysis at a second elevated temperature greater than the first elevated temperature in the absence of oxygen to yield monomeric para-xylylene, e.g., at about 690° C. and 0.5 Torr. The monomeric para-xylylene is the injected into the deposition chamber that includes the semiconductor device at a temperature lower than the first and second elevated temperatures so that the monomeric para-xylylene polymerizes on the assemblies, e.g., at about 25° C. and 0.1 Torr. This is just one example of a parylene coating process, and any other parylene deposition process can be used to coat the assemblies 60 with parylene.

According to FIG. 6C a parylene coating 65 is deposited onto the assemblies 60 and the trays 70. Each one of the parylene coated assemblies 60 can then be taken out of the apparatus and each one of the assemblies 60 can then be further processed as will be shown further below.

FIG. 7 comprises FIG. 7A to 7D and shows schematic cross-sectional side view representations for illustrating an example of a method for fabricating a semiconductor device module.

FIG. 7A shows one of the semiconductor devices 10 as were fabricated according to FIG. 6 and which was already described in connection with FIG. 1.

According to FIG. 7B an insulation layer 80 has been applied to the semiconductor device 10 in such a way that the semiconductor device 10 is completely embedded within the insulation layer 80. The material of the insulation layer 80 can be FR4.

According to FIG. 7C openings 80A are formed into the insulation layer 80 by spatially selective removal of the insulation layer 80. The openings 80A are formed in both upper and lower main faces of the insulation layer 80 in such a way that they extend until the semiconductor die 12 and the carrier 11 from above and until the carrier 11 from below. Selective removal of the insulation layer 80 can be performed, for example, by laser ablation as illustrated in FIG. 7C by the arrows.

According to FIG. 7D the openings 80A are then filled with a metallic material, in particular copper. The filling can be performed by electroplating. As a result, a semiconductor device module as shown in FIG. 2 is obtained which comprises electrical connectors 15, 16, and 17.

EXAMPLES

In the following specific examples of the present disclosure are described.

Example 1 is a semiconductor device, comprising a carrier comprising a recess, a semiconductor die disposed in the recess, and a parylene coating covering at least portions of the surfaces of the semiconductor die and the carrier.

Example 2 is the semiconductor device according to Example 1, wherein the parylene coating covers all portions of the surfaces of the semiconductor die and the carrier.

Example 3 is the semiconductor device according to example 1, wherein the parylene coating covers all portions of the surfaces of the semiconductor die and the carrier besides a connection surface between the semiconductor die and carrier.

Example 4 is the semiconductor device according to any one of the preceding Examples, wherein the parylene coating comprises one of parylene F or parylene C.

Example 5 is the semiconductor device according to any one of the preceding Examples, wherein the parylene coating comprises a thickness in a range from 0.5 μm to 10 μm.

Example 6 is the semiconductor device according to any one of the preceding Examples, wherein the semiconductor die is one or more of a semiconductor transistor die, a power semiconductor transistor die, a power IGBT die, a power MOSFET die, or a thyristor die.

Example 7 is the semiconductor device according to any one of the preceding Examples, wherein the semiconductor die comprises a first upper main face and a second lower main face opposite to the first main face, and a first contact pad on the first upper main face and a second contact pad on the second lower main face.

Example 8 is a semiconductor device module, comprising an insulation layer, and a semiconductor device according to any one of the preceding Examples, the semiconductor device being embedded in the insulation layer.

Example 9 is the semiconductor device module according to Example 8, wherein the carrier comprises a first upper main face, a second lower main face opposite to the first upper face, side faces connecting the first and second main faces, the recess is formed in the first upper face and comprises a bottom face and side faces connected with the bottom face, the semiconductor die comprises a first main face, a second main face opposite to the first main face, and side faces connecting the first and second main faces, the parylene coating covers the side faces of the semiconductor die, a portion of the bottom face of the recess, the side faces of the recess, and side faces of the carrier.

Example 10 is the semiconductor device module according to Example 8 or 9, wherein the insulation layer comprises one or more of a materials containing an epoxy material and glass fibers, an FR4 material, an FR3 material, an FR5 material, or a BT epoxy material.

Example 11 is a method for fabricating a semiconductor device, the method comprising providing a carrier comprising a recess, providing a semiconductor die and disposing the semiconductor die in the recess, and applying a parylene coating onto the carrier and the semiconductor die.

Example 12 is the method according to Example 11, wherein the parylene coating is deposited by physical vapor deposition.

Example 13 is a method for fabricating a semiconductor device module, the method comprising providing a semiconductor device as fabricated according to one of Examples 11 or 12, and embedding the semiconductor device in an insulation layer.

Example 14 is the method according to Example 13, further comprising removing a portion of the parylene layer from above a contact pad of the semiconductor die, and applying a metallic material to the contact pad.

Example 15 is the method according to Example 14, wherein the portion of the parylene layer is removed by laser ablating.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A semiconductor device, comprising
a carrier comprising a recess;
a semiconductor die disposed in the recess; and
a parylene coating covering at least portions of the surfaces of the semiconductor die and/or the carrier, wherein either:
the parylene coating covers all portions of the surfaces of the semiconductor die and the carrier; or
the parylene coating covers all portions of the surfaces of the semiconductor die and the carrier besides a connection surface between the semiconductor die and carrier.

2. The semiconductor device according to claim 1, wherein
the parylene coating comprises one of parylene F or parylene C.

3. The semiconductor device according to claim 1, wherein
the parylene coating comprises a thickness in a range from 0.5 μm to 10 μm.

4. The semiconductor device according to claim 1, wherein
the semiconductor die is one or more of a semiconductor transistor die, a power semiconductor transistor die, a power IGBT die, a power MOSFET die, or a thyristor die.

5. The semiconductor device according to claim 1, wherein the semiconductor die comprises a first upper main face and a second lower main face opposite to the first main face, and a first contact pad on the first upper main face and a second contact pad on the second lower main face.

6. A semiconductor device module, comprising
an insulation layer; and

US 12,588,546 B2

9 a semiconductor device according to claim 1, the semiconductor device being embedded in the insulation layer.

7. The semiconductor device module according to claim 6, wherein the carrier comprises a first upper main face, a second lower main face opposite to the first upper face, side faces connecting the first and second main faces;

the recess is formed in the first upper face and comprises a bottom face and side faces connected with the bottom face;

the semiconductor die comprises a first main face, a second main face opposite to the first main face, and side faces connecting the first and second main faces;

the parylene coating covers the side faces of the semiconductor die, a portion of the bottom face of the recess, the side faces of the recess, and side faces of the carrier.

8. The semiconductor device module according to claim 6, wherein the insulation layer comprises one or more of a materials containing an epoxy material and glass fibers, an FR4 material, an FR3 material, an FR5 material, or a BT epoxy material.

9. A method for fabricating a semiconductor device, the method comprising providing a carrier comprising a recess;

10 providing a semiconductor die and disposing the semiconductor die in the recess; and applying a parylene coating onto the carrier and the semiconductor die, wherein either:

the parylene coating covers all portions of the surfaces of the semiconductor die and the carrier; or the parylene coating covers all portions of the surfaces of the semiconductor die and the carrier besides a connection surface between the semiconductor die and carrier.

10. The method according to claim 9, wherein the parylene coating is deposited by physical vapor deposition.

11. A method for fabricating a semiconductor device module, the method comprising providing a semiconductor device as fabricated according to claim 9; and embedding the semiconductor device in an insulation layer.

12. The method according to claim 11, further comprising:

removing a portion of the parylene layer from above a contact pad of the semiconductor die, and applying a metallic material to the contact pad.

13. The method according to claim 12, wherein the portion of the parylene layer is removed by laser ablating.

* * * * *